United States Patent
Jouvray et al.

(10) Patent No.: US 10,260,147 B2
(45) Date of Patent: Apr. 16, 2019

(54) DEVICE FOR DEPOSITING NANOTUBES

(71) Applicant: AIXTRON SE, Herzogenrath (DE)

(72) Inventors: Alexandre Jouvray, Huntingdon (GB); David Eric Rippington, Suffolk (GB); Kenneth B. K. Teo, Cambridgeshire (GB); Nalin L. Rupesinghe, Cambridgeshire (GB)

(73) Assignee: AIXTRON SE, Herzogenrath (DE)

( * ) Notice: Subject to any disclaimer, the term of this patent is extended or adjusted under 35 U.S.C. 154(b) by 275 days.

(21) Appl. No.: 15/128,657

(22) PCT Filed: Mar. 19, 2015

(86) PCT No.: PCT/EP2015/055801
§ 371 (c)(1),
(2) Date: Sep. 23, 2016

(87) PCT Pub. No.: WO2015/144558
PCT Pub. Date: Oct. 1, 2015

(65) Prior Publication Data
US 2017/0107613 A1    Apr. 20, 2017

(30) Foreign Application Priority Data
Mar. 24, 2014  (DE) ............ 10 2014 104 011

(51) Int. Cl.
*C23C 16/26* (2006.01)
*C23C 16/455* (2006.01)
(Continued)

(52) U.S. Cl.
CPC ............. *C23C 16/26* (2013.01); *C01B 32/16* (2017.08); *C01B 32/186* (2017.08);
(Continued)

(58) Field of Classification Search
CPC ....... C23C 16/54; C23C 16/4587; B01J 4/005
See application file for complete search history.

(56) References Cited

U.S. PATENT DOCUMENTS 6,017,396 A * 1/2000 Okamoto ............ C23C 16/0245
                                                        118/719
2008/0152803 A1   6/2008 Lamouroux et al.
(Continued)

FOREIGN PATENT DOCUMENTS

CN         1924659 A      3/2007
CN       201990721 U      9/2011
(Continued)

OTHER PUBLICATIONS

International Search Report dated Sep. 2, 2015, from the European Patent Office, for International Application No. PCT/EP2015/055801 (filed Mar. 19, 2015), 9 pages.
(Continued)

*Primary Examiner* — Joseph A Miller, Jr.
(74) *Attorney, Agent, or Firm* — Ascenda Law Group, PC

(57) ABSTRACT

A device is provided for depositing carbonaceous structures, for example layers in the form of nanotubes or graphene on a substrate, which is supported by a substrate support disposed in a process chamber housing. A process gas can be delivered onto the substrate through gas outlet openings of a gas inlet element disposed in the process chamber housing. The process chamber housing has two opposing walls which each have holding recesses. At least one plate-shaped component is disposed in the process chamber housing. The plate-shaped component has two edge portions directed away from one another that each are inserted respectively in the holding recess of one of the two opposing walls.

3 Claims, 9 Drawing Sheets

(51) Int. Cl.
*C23C 16/458* (2006.01)
*C23C 16/46* (2006.01)
*C01B 32/16* (2017.01)
*C01B 32/186* (2017.01)

(52) U.S. Cl.
CPC .... *C23C 16/4587* (2013.01); *C23C 16/45565* (2013.01); *C23C 16/46* (2013.01)

(56) References Cited

U.S. PATENT DOCUMENTS

| | | |
|---|---|---|
| 2010/0319766 A1 | 12/2010 | Suh |
| 2012/0000425 A1 | 1/2012 | Park et al. |
| 2012/0003389 A1 | 1/2012 | Brien et al. |
| 2012/0142137 A1 | 6/2012 | Hu et al. |
| 2013/0017633 A1 | 1/2013 | Seo et al. |
| 2013/0084235 A1 | 4/2013 | Koike |
| 2013/0089666 A1 | 4/2013 | Boi et al. |
| 2013/0149870 A1 | 6/2013 | Tung et al. |
| 2013/0189432 A1* | 7/2013 | Nakashima ......... C01B 31/0226 427/249.1 |
| 2014/0017160 A1 | 1/2014 | Song et al. |
| 2015/0361555 A1 | 12/2015 | Sivaramakrishnan et al. |
| 2016/0111319 A1 | 4/2016 | Voelk et al. |
| 2017/0204509 A1 | 7/2017 | Fujinaga et al. |

FOREIGN PATENT DOCUMENTS

| | | |
|---|---|---|
| DE | 4036449 A1 | 5/1992 |
| DE | 9210359 U1 | 9/1992 |
| DE | 4125334 A1 | 2/1993 |
| DE | 19522574 A1 | 1/1996 |
| GB | 2458776 A | 10/2009 |
| JP | 2005-133165 A | 5/2005 |
| JP | 2009-094232 A | 4/2009 |
| JP | 2011-046415 A | 3/2011 |
| JP | 2013-026358 A | 2/2013 |
| KR | 2013/0098664 A | 9/2013 |
| WO | 2013/006959 A | 1/2013 |
| WO | 2013/069593 A1 | 5/2013 |
| WO | 2014/038803 A1 | 3/2014 |

OTHER PUBLICATIONS

Written Opinion of the International Searching Authority dated Sep. 2, 2015, from the European Patent Office, for International Application No. PCT/EP2015/055801 (filed Mar. 19, 2015), 11 pages.
International Search Report dated Apr. 29, 2015, from the European Patent Office, for International Application No. PCT/EP2015/055641 (filed Mar. 18, 2015), 5 pages.
Written Opinion of the International Searching Authority dated Apr. 29, 2015, from the European Patent Office, for International Application No. PCT/EP2015/055641 (filed Mar. 18, 2015), 6 pages.
International Preliminary Report on Patentability dated Sep. 27, 2016, from the International Bureau of WIPO,for International Application No. PCT/EP2015/055641 (filed Mar. 18, 2015), 7 pages.
International Preliminary Report on Patentability dated Sep. 27, 2016, from the International Bureau of WIPO,for International Application No. PCT/EP2015/055641 (filed Mar. 18, 2015), English Translation, 8 pages.
Written Opinion of the International Searching Authority dated Apr. 29, 2015, from the European Patent Office, for International Application No. PCT/EP2015/055641 (filed Mar. 18, 2015), English Translation, 7 pages.
International Preliminary Report on Patentability dated Sep. 27, 2016, from the International Bureau of WIPO, for International Application No. PCT/EP2015/055801 (filed Mar. 19, 2015), 12 pages.
International Preliminary Report on Patentability dated Sep. 27, 2016, from the International Bureau of WIPO, for International Application No. PCT/EP2015/055801 (filed Mar. 19, 2015), English Translation, 15 pages.
Written Opinion of the International Searching Authority dated Sep. 2, 2015, from the European Patent Office, for International Application No. PCT/EP2015/055801 (filed Mar. 19, 2015), English Translation, 14 pages.
Non-Final Office Action dated Aug. 30, 2018, for U.S. Appl. No. 15/128,070 (filed Sep. 21, 2016), 9 pages.
Amendment filed Nov. 30, 2018, for U.S. Appl. No. 15/128,070 (filed Sep. 21, 2016), 12 pages.

* cited by examiner

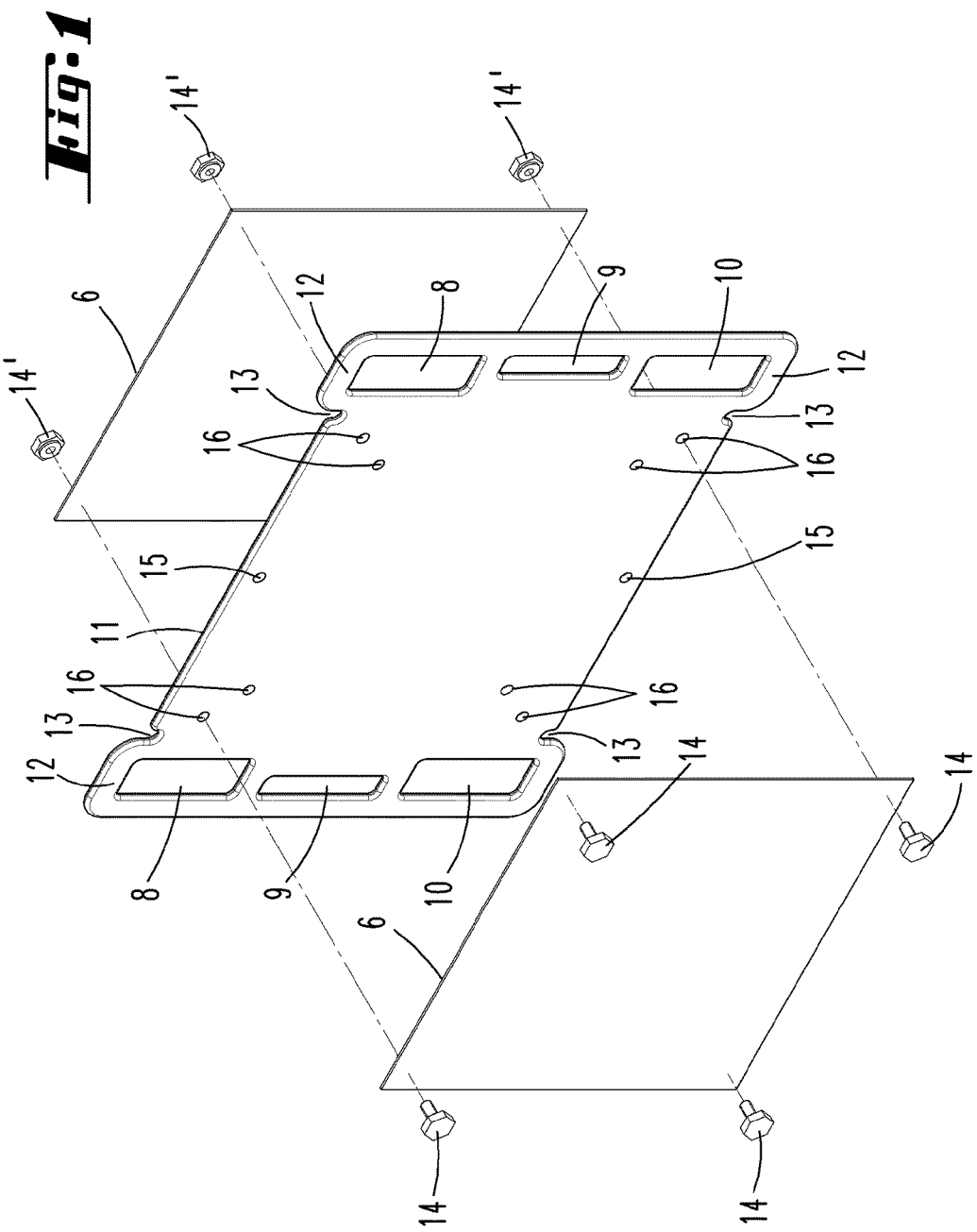

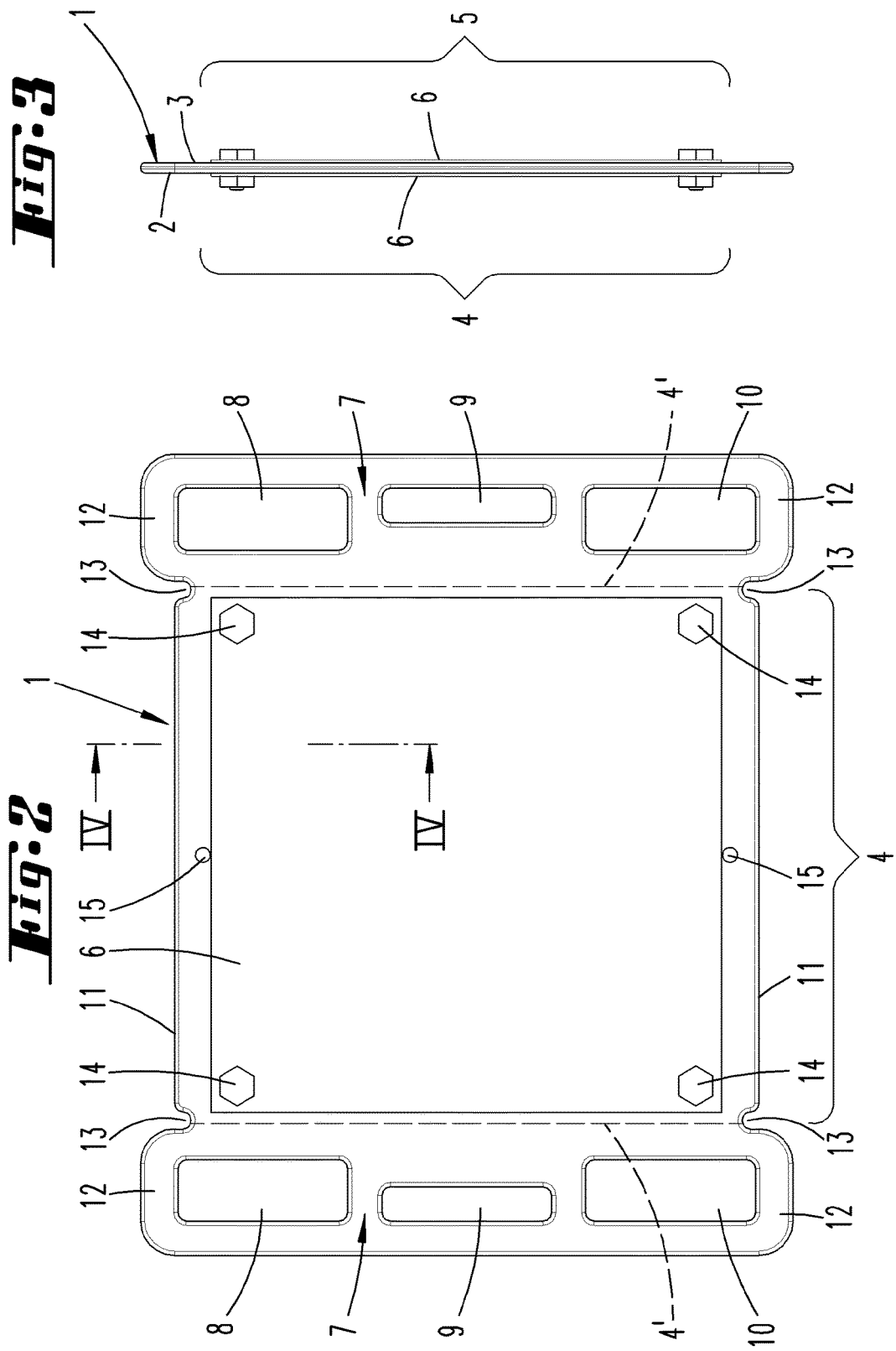

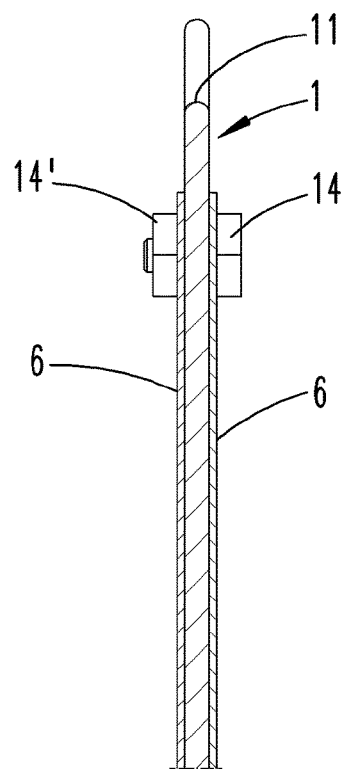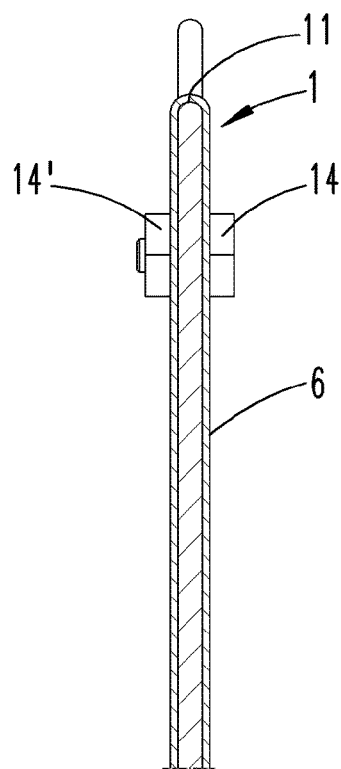

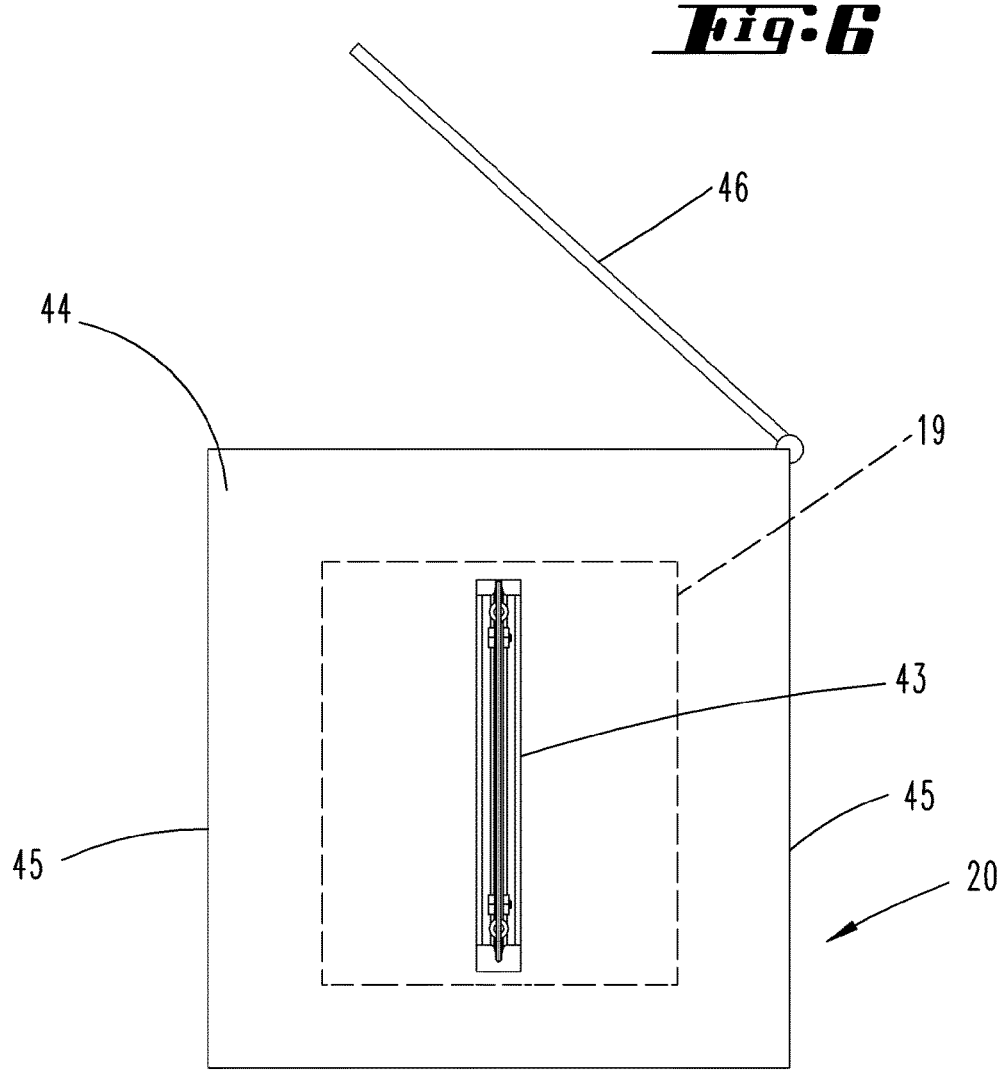

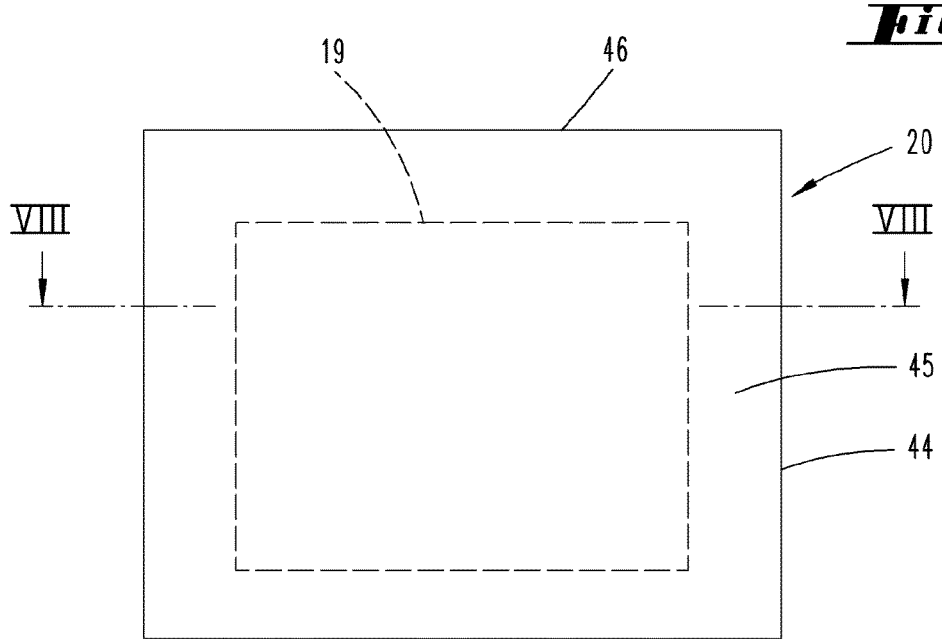

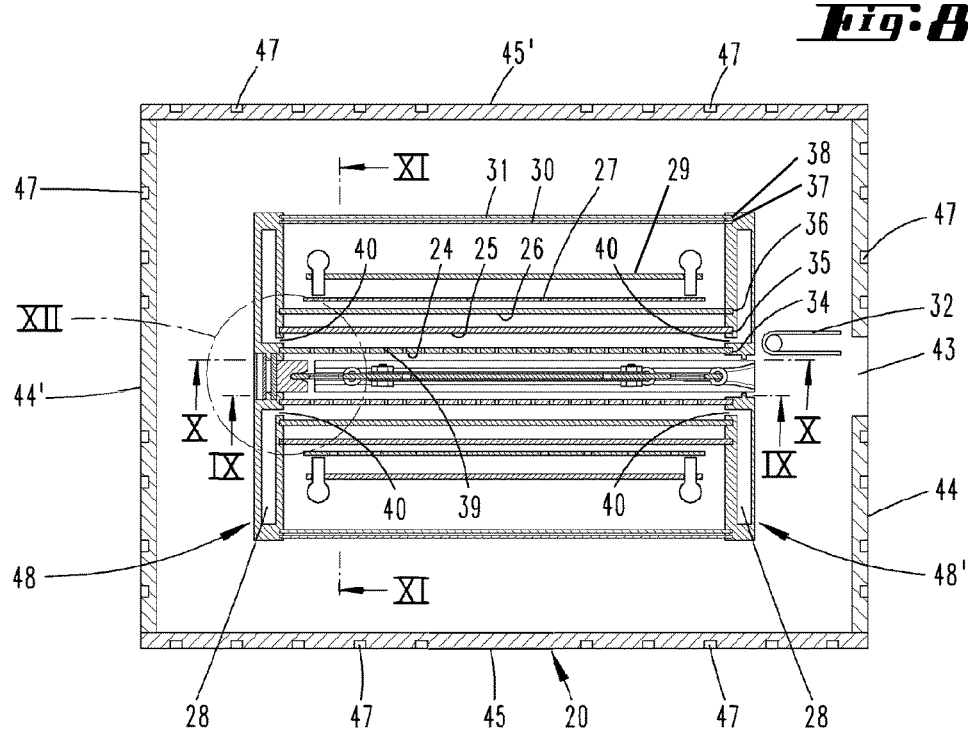

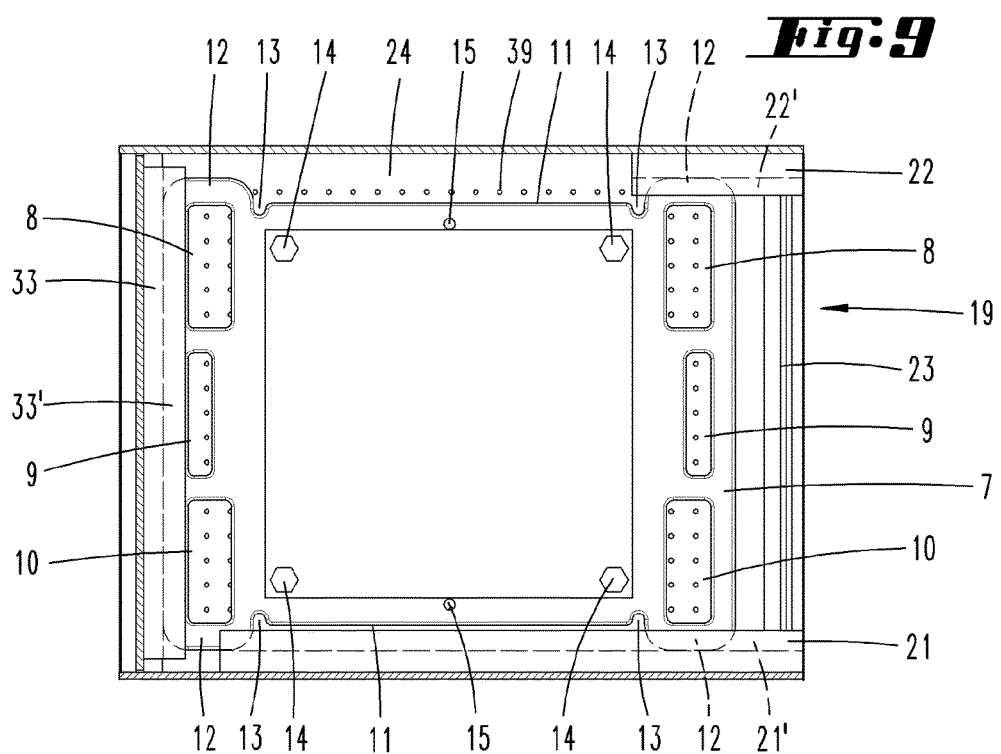

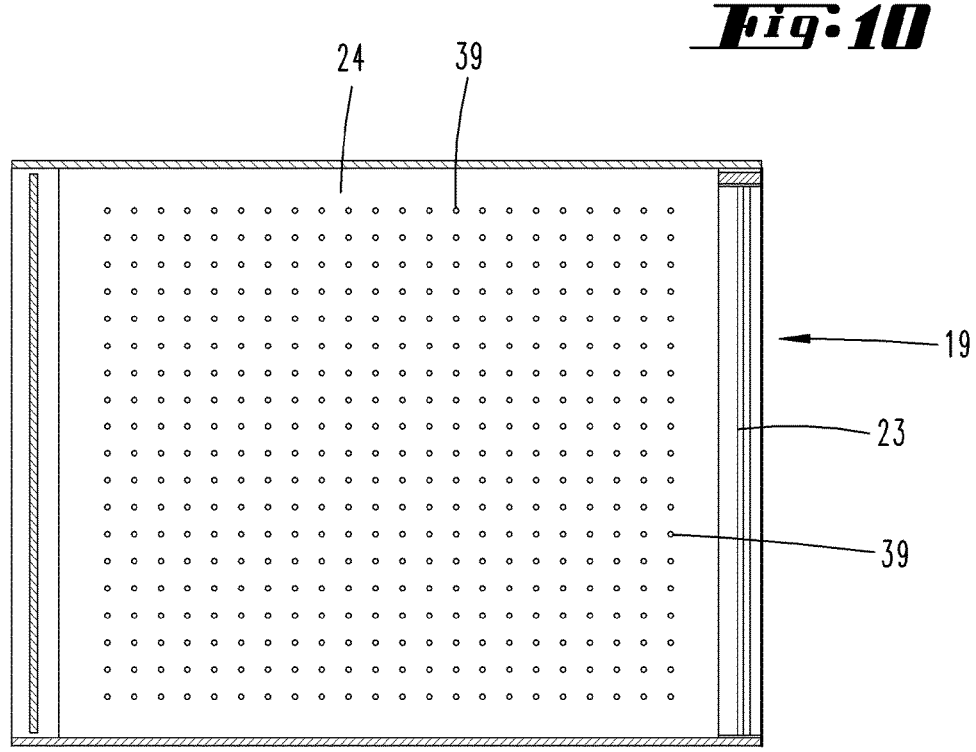

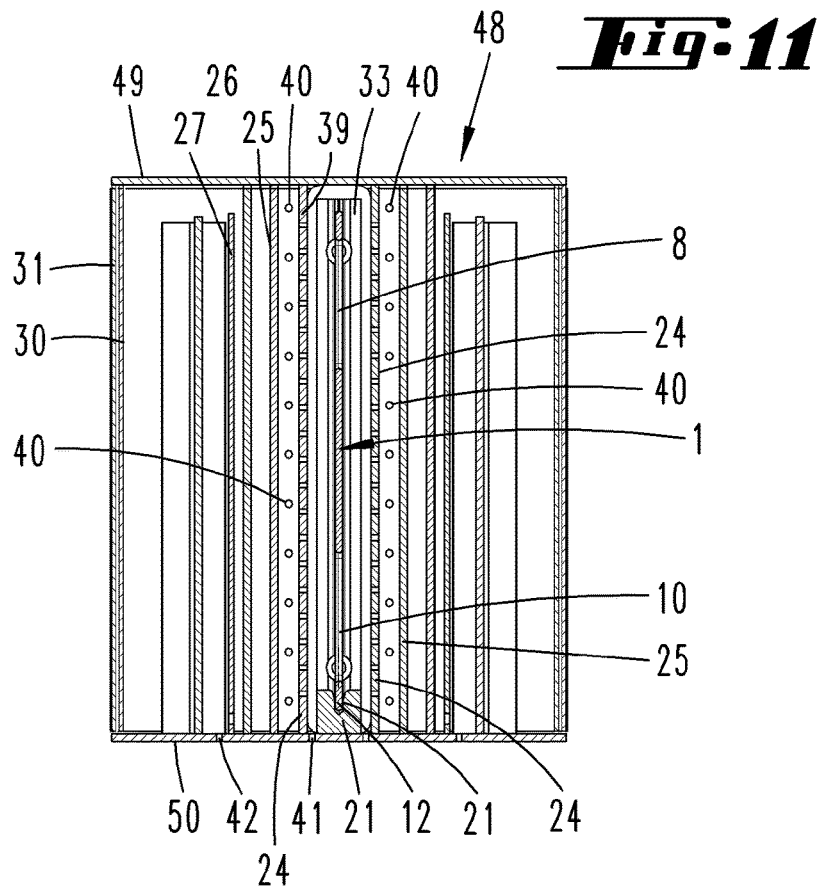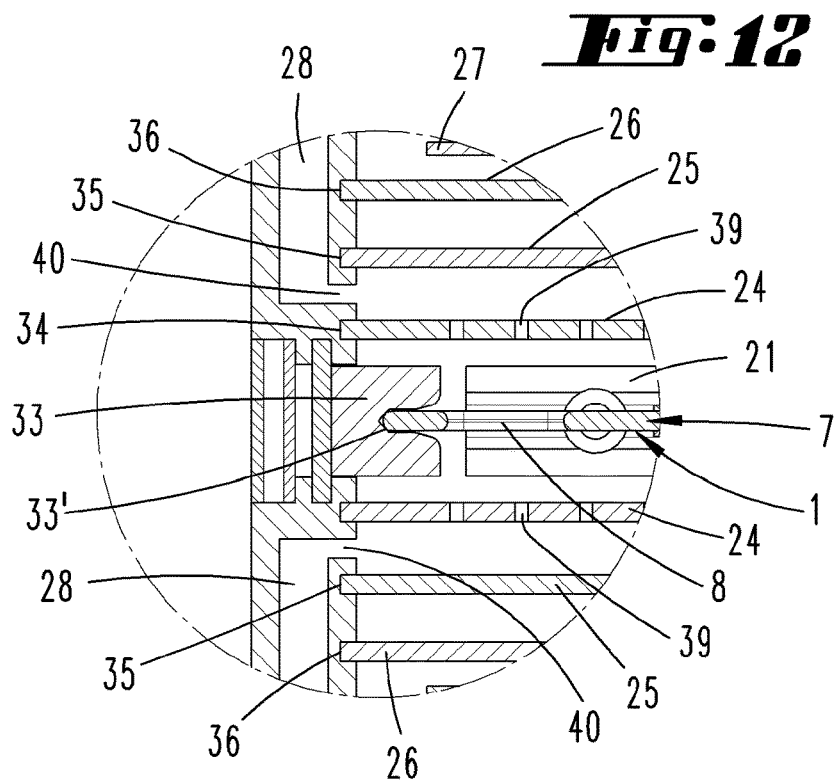

DEVICE FOR DEPOSITING NANOTUBES

RELATED APPLICATIONS

This application is a National Stage under 35 USC 371 of and claims priority to International Application No. PCT/EP2015/055801, filed 19 Mar. 2015, which claims the priority benefit of DE Application No. 10 2014 104 011.2, filed 24 Mar. 2014.

FIELD OF THE INVENTION

The invention relates to a device for depositing structures containing carbon, for example layers in the form of nanotubes or graphene, on at least one substrate which is carried by a substrate carrier which is disposed in a processing-chamber housing, wherein, via gas-outlet openings of a gas-inlet element which is disposed in the processing-chamber housing, a process gas is infeedable towards the at least one substrate.

BACKGROUND

A device for coating substrates is disclosed in DE 195 22 574 A1, US 2010/0319766 A1, and US 2013/0084235 A1. The substrates in part lie on substrate carriers; however, the substrates in part are also suspended freely between two mutually opposite gas-inlet elements. US 2013/0089666 A1 describes a copper substrate that has two broadside faces.

The invention relates to a device for depositing nanotubes of carbon. To this end, gaseous primary materials are placed in a processing chamber. This is performed by means of a gas-inlet element. A substrate which is disposed on a substrate carrier is located within the processing chamber. A carbon-containing process gas, for example $CH_4$, $C_2H_4$, $C_2H_2$, or $C_6H_6$ is introduced into the processing chamber. Devices for coating flexible substrates are described inter alia in GB 2 458 776 A, or JP 2005-133165 A.

US 2012/0000425 A1 describes a device for thermally treating substrates, in which device a plurality of substrate carriers are disposed so as to lie horizontally on top of one another in a processing chamber.

US 2008/0152803 A1 describes a device for thermally treating substrates, wherein the substrates are radially disposed in a processing chamber.

SUMMARY OF THE INVENTION

The invention is based on the object of refining a device of the generic type in a manner that is advantageous in terms of use.

The object is achieved by the invention stated in the claims.

Firstly and substantially, it is proposed that the processing-chamber housing has walls having cavities through which the gas volume of the gas-inlet element is fed with process gases. Accordingly, the walls of the processing-chamber housing are provided with filling into which the process gas may be infed from the outside such that said process gas may be infed through gas-infeed openings, in particular from the periphery, into the gas volume of the gas-inlet element. A multiplicity of plate-shaped elements are preferably disposed within the processing-chamber housing. The plate-shaped elements on peripheries thereof that point away from one another have peripheral portions which are plug-fitted into retaining clearances that are configured by two mutually parallel-running walls of the processing-chamber housing. The retaining clearances are preferably configured by grooves having mutually parallel-running groove walls. The openings of the grooves of the two walls are mutually facing. A rectangular plate may be plug-fitted into each one of the groove pairs. The processing-chamber housing preferably has a construction which is symmetrically folded. The symmetrical plane is a central plane in which a substrate carrier may be located. The substrate carrier on each of the broad sides thereof that point away from one another may carry substrates which may be simultaneously coated. To this end, the processing-chamber housing on both sides of the vertically extending substrate carrier has one gas-inlet element. The respective gas-inlet element is configured by a plate-shaped element which has a multiplicity of gas-outlet openings. Said plate-shaped element is a gas-inlet plate through which the process gas may flow into the processing chamber, the substrate carrier being located in the center of the latter. A rear wall by way of which a gas volume of the gas-inlet element in the direction away from the processing chamber is closed is located to the rear of the gas-inlet plate. The gas-inlet plate and the rear wall each form peripheral portions which are plug-fitted into retaining clearances. Gas-infeeding of the process gas according to the invention is performed so as to emanate from the processing-chamber housing wall. The gas volume of the gas-inlet element is preferably located in an intermediate space between a gas-inlet plate and a rear wall. The processing-chamber housing wall has a multiplicity of gas-infeed openings which open into the intermediate space between the gas-inlet plate and the rear wall. The processing-chamber housing wall has a hollow feature into which process gas may be fed from the outside. The hollow feature distributes the process gas to the individual infeed openings which open into the gas volume of the gas-inlet element. A quartz plate is located to the rear of the rear wall. A resistance heater which generates infrared radiation is located to the rear of the quartz plate. The quartz plate and the two plates that form the gas-inlet element are transparent to infrared radiation and are composed of quartz. It may be furthermore provided that a rear wall and a reflector likewise have peripheral portions which are plug-fitted into retaining clearances. Replacing the plate-shaped elements that are plug-fitted into the retaining clearances, thus replacing the gas-inlet plate, the rear wall, the quartz plate, the reflector, or the rear wall is enabled in a simple manner. It is only necessary for a ceiling of the processing-chamber housing to be removed. The plate-shaped elements may then be pulled through the retaining clearances, extending in the vertical direction, and out of the processing-chamber housing. Assigning the plate-shaped elements to the processing-chamber housing is performed in the reverse manner. The processing-chamber housing is preferably disposed within a reactor housing. The reactor housing may have a cover such that the ceiling of the processing-chamber housing is accessible. The reactor housing is gas-tight in the case of the cover being closed, such that the former may be evacuated.

The invention moreover relates to a device for depositing in particular carbon-containing structures, or layers of nanotubes or graphene, on a substrate, wherein the processing-chamber housing has two mutually opposite walls which are perpendicular to the substrate carrier and which have retaining clearances into which two peripheral portions, pointing away from one another, of a plate-shaped component are plugged. The plate-shaped component may be the gas-inlet plate, a rear wall of the gas-inlet element, a shielding plate, a reflector, or a rear wall of the processing-chamber housing. According to the invention, at least one of these plate-shaped components by being displaced in the plane of extent thereof is removable from the processing-chamber housing.

BRIEF DESCRIPTION OF THE DRAWINGS

One exemplary embodiment of the invention will be explained hereunder by means of appended drawings in which:

FIG. 1 shows an exploded illustration of a substrate carrier;

FIG. 2 shows the broadside view of a substrate carrier;

FIG. 3 shows the narrow-side view of a substrate carrier;

FIG. 4 shows the section according to line IV-IV in FIG. 2, wherein one substrate 6 is disposed on each of the two broadside faces of the substrate carrier;

FIG. 5 shows an illustration according to FIG. 4, wherein the substrate carrier 1 carries a flexible substrate 6 which extends beyond the peripheral edge 11;

FIG. 6 shows a lateral view of a reactor housing 20 having the cover 46 opened, and having the processing-chamber housing 19 indicated as being disposed in the former;

FIG. 7 shows the reactor housing 20 in the front view, having the cover closed, and having the processing-chamber housing 19 indicated as being disposed in the former;

FIG. 8 shows a section according to line VIII-VIII in FIG. 7;

FIG. 9 shows a section according to line IX-IX in FIG. 8, with a view of the substrate carrier 1 disposed in the processing-chamber housing 19;

FIG. 10 shows a section according to line X-X in FIG. 8, with a view of the gas-inlet plate 24;

FIG. 11 shows a section according to line XI-XI in FIG. 8, with a view of that side of a wall 48 of the processing-chamber housing 19 that is on the internal side of the processing-chamber housing;

FIG. 12 shows the enlarged fragment XII in FIG. 8.

DETAILED DESCRIPTION OF THE INVENTION

The reactor housing 20 illustrated in the drawings has a cuboid-shaped design having four side walls 44, 44'; 45, 45'. The upper housing wall forms an upwardly pivotable cover 46. The cover 46 is closed when the reactor is in operation. However, said cover 46 may be opened for maintenance purposes.

The side walls 44, 44'; 45, 45' have ducts 47 through which a cooling liquid may flow so as to purge the walls 44, 44'; 45, 45'.

One of the side walls 44 has an opening 43 extending in the vertical direction. The opening 43 may be closed off in a gas-tight manner by a slide (not illustrated). Said opening 43 is a loading and unloading opening.

A processing-chamber housing 19 which likewise has a loading and unloading opening 23 extending in the vertical direction is located within the reactor housing 20. The processing-chamber housing 19 in the interior thereof has a lower guide element 21 and an upper guide element 22. Both guide elements 21, 22 are strip-shaped and have mutually facing grooves 21', 22'. Two gas-inlet elements 24, 25 delimit vertical sides of a processing chamber. A substrate carrier 1 may be pushed through the vertical loading openings 23, 43 and into the processing chamber. Herein, guide portions 12 of the substrate carrier 1 engage in grooves 21', 22' of the guide elements 21, 22. In the inserted state, the substrate carrier 1 is located in the center between the two gas-inlet elements 24. All six walls of the cuboid-shaped reactor housing 20 may have temperature-control ducts 47 through which a temperature-control liquid may flow, so as to either cool or heat the reactor walls.

The substrate carrier 1 is a planar body and has a substantially rectangular footprint. Said substrate carrier 1 has two broadside faces 2, 3 that point away from one another, each configuring one substrate-receiving zone 4, 5. The substrate-receiving zones 4, 5 which point away from one another have a substantially rectangular footprint.

FIG. 2 shows a broadside face 2 having the substrate-receiving zone 4. The opposite broadside face 3 having the substrate-receiving zone 5 thereof is of identical configuration.

The planar body of which the substrate carrier 1 is composed has a material thickness which is less than 10 mm. The peripheral-edge length of the substrate carrier 1 is at least 100 mm.

The substrate-receiving zone 4 which is of identical design to that of the substrate-receiving zone 5 has two first peripheries 4'. The first peripheries 4' are imaginary lines. The substrate-receiving zone 4 moreover has second peripheries which are configured by peripheral edges 11 of the substrate carrier 1. The peripheral edges 11 are rounded.

Fixing elements 14 are located in corner regions of the substrate-receiving zones 4, 5. The fixing elements 14 in the exemplary embodiment are illustrated as screws having nuts 14'. However, the fixing elements 14, 14' may also be clamping elements. A substantially rectangular substrate 6 is fastened onto one of the two substrate-receiving zones 4, 5 by way of these fixing elements 14, 14'. One substrate 6 is located on each one of the two broadside faces 2, 3 such that the two substrate-receiving zones 4, 5, pointing away from one another, each carry one substantially rectangular substrate 6, wherein the substrates 6 are fastened to the substrate carrier 1 by way of the fixing elements 14, 14'. The substrates may be copper, aluminum, or nickel substrates that are coated with nanotubes composed of carbon that grow transversely to the plane of extent on the substrate surface.

The peripheral edges 11 transition to protrusions 12, while configuring an embayment 13. Said protrusions 12 are the abovementioned guide protrusions. The latter are configured by the two end portions of peripheral portions 7 of the substrate carrier 1. The peripheral portions 7 are directly adjacent to the peripheries 4'. One peripheral portion 7, each configuring one handling portion, is adjacent to each of the two peripheries 4' that point away from one another. The protrusions 12 extend in the plane of extent of the substrate carrier 1 and configure peripheral portions that are spaced apart from the peripheral edge 11.

The two identically designed handling portions 7 not only have the protrusions 12 that protrude beyond the respective peripheral edge 11 of the substrate-receiving zone 4, 5, but also have window-type openings 8, 9, 10. The latter herein are three rectangular openings through which gas may flow, but which may also be used for manual handling. To this end, the openings 8, 9, 10 are used as gripping openings. The central rectangular opening may be gripped by a gripper of a manipulation arm.

As is shown in FIG. 1, the substrate carrier 1 has various bores 15, 16. The bores 16 serve for fixing the fixing elements 14 to the substrate carrier 1. The bore may likewise be used as a fastening bore for a fixing element. The bore 15 may also have a stop element, however.

FIG. 4 shows a first type of use for the substrate carrier 1, in which the substrate carrier 1 on each of the broadside faces 2, 3 thereof that point away from one another carries one substrate 6.

FIG. 5 shows a second type of use for the substrate carrier 1. Herein, the substrate 6 carried by the substrate carrier 1 is flexible. Said substrate 6 has two end portions, each being assigned to one of the two substrate-receiving zones 4, 5 and being fastened thereto. A central portion of the substrate 6 bears on the rounded peripheral edge 11. The substrate 6 is thus folded in a U-shaped manner around the peripheral edge 11.

The substrate may be a thin copper, nickel or aluminum foil. A process gas ($H_2$, $NH_3$, AR, $N_2$, $CH_4$, $C_2H_4$, $C_2H_2$, or $C_6H_6$) is directed into the processing chamber by way of the gas-inlet elements 24. By way of a chemical, in particular a catalytic, reaction, the hydrocarbons are fractionized to form carbon. This herein may be a pyrolytic surface reaction. Graphene is deposited on the substrate, or nanotubes are deposited thereon.

The interior space of the reactor housing 20 may be evacuated. A vacuum pump (not illustrated) serves this purpose.

The processing-chamber housing 19 has six walls which run parallel with a corresponding wall of the reactor housing 20. The walls of the processing-chamber housing 19 are spaced apart from the walls of the reactor housing 20.

At least one wall 48 of the processing-chamber housing 19 configures one or a plurality of cavities 28. This at least one cavity 28 is a component part of a gas-infeed installation. The cavity 28 may be fed from the outside with a process gas which, as will be explained in more detail hereunder, may enter the interior of the processing-chamber housing 19 by way of openings 40. Two mutually opposite housing walls 48, 48' which are configured in multiple parts are provided. The housing wall 48' configures the abovementioned loading opening 23. Both housing walls 48, 48' on that side thereof that faces the interior of the processing-chamber housing 19 have a multiplicity of retaining clearances 34 to 38 that run mutually parallel and in the vertical direction. The retaining clearances 34 to 38 each are formed by vertical grooves. The peripheries of plate-shaped elements 24, 25, 26, 30, 31 of the processing-chamber housing 19 are located in the retaining clearances 34 to 38. The processing-chamber housing 19 in relation to a central plane is of a design with folding symmetry. The substrate carrier 1, or the retaining elements 21, 22 and 33, which each have grooves 21', 22', and 33' for mounting the substrate carrier 1, is/are located in this central plane, respectively.

A gas-inlet element in the shape of a shower head is located on at least one of the broad sides of the substrate carrier 1. In the case of the exemplary embodiment, one gas-inlet element, each in the form of a shower head, is located on each of the two broad sides of the substrate carrier.

One gas-inlet element, each in the form of a shower head, is located on each of the two broad sides of the substrate carrier 1. The respective shower head is configured by a gas-inlet plate 24 which is made of quartz and which by way of two peripheries, pointing away from one another, is in each case plug-fitted into one retaining clearance 34. The gas-inlet plate 24 has a multiplicity of gas-outlet openings 39 which are uniformly distributed across the area of the gas-inlet plate 24, for exiting a process gas which is transported by a carrier gas into the processing chamber which is disposed between the two mutually opposite gas-inlet plates 24.

A volume which is supplied with process gas or carrier gas, respectively, by the abovementioned gas-infeed openings 40, which gas may enter through the gas-outlet openings 39 into the processing chamber, is located to the rear of the gas-inlet plate 24 in relation to the position of the processing chamber.

A rear wall 25 of the gas-inlet element extends parallel with the gas-inlet plate 24. The lateral edges of the rear wall 25 are plug-fitted into the retaining clearances 35. The rear wall seals the gas-inlet element in the direction away from the gas-inlet plate and delimits the gas volume of the gas-inlet element. The gas-inlet plate 24 and the rear wall 25 run so as to be mutually parallel.

A further quartz plate 26, the peripheries of which are plug-fitted in retaining clearances 36, is located to the rear of the rear wall 25.

A resistance heater 27 is located to the rear of the quartz plate 26. This herein is a metal plate, running in a meandering manner, through which a current may flow such that the heating element 27 may be heated. The gas-inlet plate 24, rear wall 25, and plate 26, all composed of quartz, are substantially transparent to the infrared radiation which is generated by the heating element 27 and which may heat the substrate 6 to a substrate temperature of approximately 1000° C. Connector contacts for supplying a current to the two heating elements 27 are provided.

A shielding plate 29 which may also act as a reflector is located to the rear of the heating element 27. This shielding plate 29 is fastened to the mounting of the heating element 27, which mounting also serves for supplying a current.

The peripheries of a reflector 30 and of a rear wall 31 are plug-fitted into the retaining clearances 37, 38 which run parallel with the vertical peripheries of the walls 48, 48'.

The processing-chamber housing 19 has a ceiling 49 which is removable. If the ceiling 49 is removed with the cover 46 opened, the plates 24, 25, 26, 30, 31 may be pulled upward out of the processing-chamber housing 19. Said plates 24, 25, 26, 30, 31 may then be cleaned or replaced. The plates 24, 25, 26, 30, 31 may again be plug-fitted in a likewise simple manner in the respectively assigned retaining clearances 34 to 38.

The base plate 50 has gas-outlet openings 41 from which the gas that has flowed through the opening 39 into the processing chamber may exit the processing chamber. Gas-outlet openings 42, which serve for exiting a purging gas which is fed into the space beyond the two shower heads in which the heating element 27 is located, are furthermore provided.

The abovementioned guide elements 21, 22, 33 each have one groove-shaped clearance 21', 22', 33' which by way of a rounded mouth region configure pilot flanks for the peripheral edge of the substrate carrier 1.

It can be seen from FIG. 9 that the peripheral edges 11 sit freely in the plug-fitted state. Said peripheral edges are spaced apart from the guide elements 21 and 22, respectively.

A reflector 32, which is rotatable about a vertical axis, is located upstream of the loading opening 23 of the processing-chamber housing 19. During operation of the processing chamber, the rotatable reflector 32 assumes a position such that the reflection face thereof is in front of the loading opening 23. If the processing chamber is intended to be loaded or unloaded, the rotatable reflector 32 is swiveled such that the two mutually aligned openings 23, 43 are free with respect to the passage of the substrate carrier 1.

Two mutually parallel-running housing walls 48, 48' which each have cavities 28 for infeeding gas through a gas-infeed opening 40 into the gas volume of the gas-inlet element 24, 25 are in particular provided. The openings 40 extend at uniform spacing across the entire depth of the housing wall 48, 48'. Each of the two housing walls 48, 48' may be configured by two part-walls, wherein each of the two part-walls configures one gas-infeed installation 28 in the form of a cavity. Each part-wall is assigned to one of two gas-inlet elements 24, 25; the housing walls 48, 48' may be configured by a plurality of interconnected components such that said cavity 28 is configured within the housing wall 48, 48'. The cavity is supplied with process gas by way of a gas-infeed line. The respective opening of the cavity 28 may be provided on a narrow side of the housing wall 48, 48'. Said narrow side is preferably a lower or an upper narrow side of the housing wall 48, 48' that is connected to a supply line through which the process gas may be infed to the cavity 28. The supply line (not shown in the drawings) herein runs through the wall of the reactor housing 20 to the outside of the reactor where a gas-supply installation to which the supply line is connected is located.

The cavity 28 in the exemplary embodiment has a substantially rectangular cross section; however, it is also provided that the cavity 28 is only configured by one or by a plurality of bores which have a minor volume.

The information above serves for explaining the inventions as comprised in their entirety by the application, which in each case individually refine the prior art at least by way of the combinations of features hereunder, namely:

Device characterized in that the processing-chamber housing 19 has at least one wall 48, 48' having a cavity 28, wherein the cavity 28 by means of gas-infeed openings 40 is connected to the gas volume of the gas-inlet element 24, 25.

Device characterized in that the gas-infeed openings 40 open out in particular between a rear wall 25 and a gas-inlet plate 24 of the gas-inlet element.

Device characterized in that the processing-chamber housing 19 has mutually opposite walls 48, 48' having cavities 28, wherein each cavity 28 by way of gas-infeed openings 40 is connected to the gas volume of the gas-inlet element 24, 25.

Device characterized in that the processing-chamber housing 19 has a construction which is symmetrically folded in relation to the plane in which the substrate carrier 1 is located, wherein the substrate carrier 1 is a planar body which extends in the symmetrical plane and the two broadsides of which can in each case carry one substrate 6 and a gas-outlet plate 24 including gas-outlet openings 39 lies opposite each of the two faces 2, 3 of the broadsides of the substrate carrier 1, wherein the respective gas volume which is disposed to the rear of the gas-inlet plate 24 is fed through gas-infeed openings 40 of at least one of the processing-chamber housing walls 48, 48'.

Device characterized in that the at least one cavity 28 by way of a supply line is connected to a gas-mixing system which provides the process gas, wherein the supply line is assigned in particular to a narrow side of the wall 48, 48'.

Device characterized in that the processing-chamber housing 19 has two mutually opposite walls 48, 48' which are perpendicular to the substrate carrier 1 and which have retaining clearances 34, 35, 36, 37, 38 in which two peripheral portions, pointing away from one another, of a plate-shaped component are plug-fitted, said plate-shaped component being the gas-inlet plate 24 and/or a rear wall 25 of the gas-inlet element 24, 25, and/or a shielding plate 26, and/or a reflector 30, and/or a rear wall 31 of the processing-chamber housing 19, and said plate-shaped component by being displaced in the plane of extent thereof being removable from the processing-chamber housing 19.

Device characterized in that a heating unit 27 in particular for generating infrared radiation is disposed to the rear of the gas-inlet element 24, 25, in particular to the rear of both gas-inlet elements 24, 25.

Device characterized in that the gas-inlet plate 24, the rear wall 25 and, if applicable, a plate 26 which is disposed to the rear of the rear wall 25 are composed of a material which is permeable to thermal radiation, in particular of quartz.

Device characterized in that all plate-shaped elements 24, 25, 26, 30, 31 are disposed in parallel planes and can be removed from the processing-chamber housing 19 in the vertical direction, wherein the substrate carrier 1 which extends in a parallel plane thereto is removable from the processing-chamber housing 19, in particular in the horizontal direction, through a loading opening 23, 43.

Device characterized in that the processing-chamber housing 19 is disposed in a reactor housing 20 which is outwardly gas-tight and which includes a cover 46 which is openable about a pivot axis.

Device characterized in that the walls of the reactor housing 20 are controllable for temperature and, to this end, include in particular cooling ducts 47.

Device characterized in that a base plate 50 which forms the base of the processing-chamber housing 19 includes gas-outlet openings 41, 42.

All features disclosed (per se, or else in mutual combination) are relevant to the invention. Herein, the entire disclosed content of the associated/appended priority documents (copy of the preliminary application) is included in the disclosure of the application, also for the purpose of conjointly including features of those documents in claims of the present application. The dependent claims by way of the features thereof characterize individual inventive refinements of the prior art, in particular so as to perform divisional applications based on these claims.

LIST OF REFERENCE SIGNS

1 Substrate carrier
2 Broadside face
3 Broadside face
4 Substrate-receiving zone
4' Periphery
5 Substrate-receiving zone
5' Periphery
6 Substrate
7 Handling portion/Peripheral portion
8 Opening
9 Opening
10 Opening
11 Peripheral edge
12 Protrusion/Guide portion
13 Embayment
14 Fixing element/Screw
14' Fixing element/Nut
15 Bore
16 Bore
19 Processing-chamber housing
20 Reactor housing
21 Guide element
21' Groove, clearance
22 Guide element
22' Groove
23 Loading/Unloading opening
24 Gas-inlet element, gas-inlet plate
25 Rear wall
26 Quartz plate 27 Heating element
28 Gas-infeed installation; cavity
29 Shielding plate
30 Reflector
31 Rear wall
32 Rotatable reflector
33 Retaining element
34 Retaining clearance
35 Retaining clearance
36 Retaining clearance
37 Retaining clearance
38 Retaining clearance
39 Gas-outlet opening
40 Gas-infeed opening
41 Gas-outlet opening
42 Gas-outlet opening
43 Loading opening
44 Wall
44' Wall
45 Wall
45' Wall
46 Wall, cover
47 Temperature-control duct
48 Housing wall
48' Housing wall
49 Ceiling plate
50 Base plate

What is claimed is:

1. A device for depositing structures containing carbon on a first and second substrate (6) which are carried by a substrate carrier (1) which extends in a first plane and which is disposed in a processing-chamber housing (19), wherein the processing-chamber housing (19) has a construction which is symmetric about the first plane, wherein the substrate carrier (1) is a planar body which extends in the first plane, wherein a first broadside face (2) of the substrate carrier (1) is configured to carry the first substrate, wherein a second broadside face (3) of the substrate carrier (1) is configured to carry the second substrate, wherein the first broadside face (2) of the substrate carrier (1) lies opposite to a first gas-inlet plate (24), having first gas-outlet openings (39), of a first gas-inlet element (24, 25), wherein the second broadside face (3) of the substrate carrier (1) lies opposite to a second gas-inlet plate (24), having second gas-outlet openings (39), of a second gas-inlet element (24, 25), wherein a process gas is delivered through the first gas-outlet openings (39) towards the first substrate (6), wherein the process gas is delivered through the second gas-outlet openings (39) towards the second substrate (6), wherein the processing-chamber housing (19) has a first wall (48) having a first cavity (28), wherein the first cavity (28) by means of first gas-infeed openings (40) is connected to a gas volume of the first gas-inlet element (24, 25) that is disposed adjacent to the first gas-inlet plate (24), wherein the processing-chamber housing (19) further comprises a second wall (48') which is oriented opposite from and parallel to the first wall (48), wherein the second wall (48') has a second cavity (28), wherein the second cavity (28) by means of second gas-infeed openings (40) is connected to the gas volume of the first gas-inlet element (24, 25), and wherein the processing-chamber housing (19) is shaped as a cuboid.

2. The device of claim 1, wherein the first gas-infeed openings (40) open out at least between a rear wall (25) and the first gas-inlet plate (24) of the first gas-inlet element (24, 25).

3. The device of claim 1, wherein the first cavity (28) by way of a supply line is connected to a gas-mixing system which provides the process gas, and wherein the supply line is connected to a side of the first wall (48).

* * * * *